US009559159B2

(12) United States Patent
Zhang

(10) Patent No.: US 9,559,159 B2
(45) Date of Patent: Jan. 31, 2017

(54) LOW-TEMPERATURE POLYSILICON MEMBRANE AND PREPARATION METHOD THEREOF, THIN-FILM TRANSISTOR AND DISPLAY DEVICE

(71) Applicant: BOE Technology Group Co., Ltd., Beijing (CN)

(72) Inventor: Huijuan Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/421,955

(22) PCT Filed: Apr. 23, 2014

(86) PCT No.: PCT/CN2014/076046

§ 371 (c)(1),
(2) Date: Feb. 16, 2015

(87) PCT Pub. No.: WO2015/096320

PCT Pub. Date: Jul. 2, 2015

(65) Prior Publication Data

US 2016/0035819 A1 Feb. 4, 2016

(30) Foreign Application Priority Data

Dec. 24, 2013 (CN) .......................... 2013 1 0722877

(51) Int. Cl.
*H01L 21/20* (2006.01)
*H01L 21/36* (2006.01)
(Continued)

(52) U.S. Cl.
CPC ......... *H01L 29/04* (2013.01); *H01L 21/02422* (2013.01); *H01L 21/02502* (2013.01);
(Continued)

(58) Field of Classification Search
CPC .... H01L 29/04; H01L 29/786; H01L 29/6675; H01L 21/02422; H01L 21/02502; H01L 21/02532; H01L 21/02686
(Continued)

(56) References Cited

U.S. PATENT DOCUMENTS 6,136,632 A * 10/2000 Higashi ............... H01L 27/1285 257/353
6,323,071 B1 * 11/2001 Zhang ................. H01L 21/2022 257/E21.133

(Continued)

FOREIGN PATENT DOCUMENTS

CN 1933104 A 3/2007
CN 101819999 A 9/2010

(Continued)

OTHER PUBLICATIONS

International Search Report and Written Opinion mailed Sep. 24, 2014 (PCT/CN2014/076046); ISA/CN.

(Continued)

*Primary Examiner* — Dao H Nguyen
(74) *Attorney, Agent, or Firm* — Banner & Witcoff, Ltd.

(57) ABSTRACT

A method for preparing an LTPS membrane, including: forming an amorphous silicon (a-Si) layer (S3) on a substrate (S1) by a patterning process, in which the a-Si layer (S3) comprises a plurality of convex structures (S32) and etched areas (S31) which are disposed along circumference of the plurality of convex structures and partially etched; and performing excimer laser crystallization (ELC) on the a-Si layer (S3) and obtaining the LTPS membrane. A thin-film transistor (TFT) and a display device are further disclosed, which are used for overcoming poor uniformity of the polysilicon membrane prepared by the ELC technology.

14 Claims, 4 Drawing Sheets

(51) Int. Cl.
*H01L 29/04* (2006.01)
*H01L 21/02* (2006.01)
*H01L 29/786* (2006.01)
*H01L 29/66* (2006.01)

(52) U.S. Cl.
CPC .. *H01L 21/02532* (2013.01); *H01L 21/02686* (2013.01); *H01L 29/6675* (2013.01); *H01L 29/786* (2013.01)

(58) Field of Classification Search
USPC ........................ 257/66, 71, 72, 88, E21.134, E21.413,257/E21.461, E29.278, E29.292, E33.053,257/E33.062; 438/24, 149, 166, 479, 486, 487, 438/778
See application file for complete search history.

(56) References Cited

U.S. PATENT DOCUMENTS

| | | | | |
|---|---|---|---|---|
| 7,560,365 | B2 * | 7/2009 | Lin | H01L 21/2026 257/E21.133 |
| 7,633,085 | B2 * | 12/2009 | Suzawa | H01L 21/31116 257/40 |
| 2001/0008781 | A1 * | 7/2001 | Lee | H01L 27/1214 438/153 |
| 2006/0060848 | A1 * | 3/2006 | Chang | H01L 21/2026 257/52 |
| 2007/0054473 | A1 | 3/2007 | Lin et al. | |
| 2008/0182392 | A1 * | 7/2008 | Yeh | H01L 21/02532 438/486 |
| 2010/0006856 | A1 * | 1/2010 | Leonardi | H01L 21/2026 257/72 |
| 2010/0221899 | A1 * | 9/2010 | Okumura | H01L 21/2026 438/487 |

FOREIGN PATENT DOCUMENTS

| | | | |
|---|---|---|---|
| CN | 103681776 | A | 3/2014 |
| KR | 1020060013106 | A | 2/2006 |

OTHER PUBLICATIONS

Oct. 26, 2015—(CN)—First Office Action No. 201310722877.7 English Tran.
Apr. 1, 2016—(CN)—Second Office Action Appn 201310722877.7 with English Tran.
Jun. 28, 2016—International Preliminary Report on Patentability Appn PCT/CN2014/076046.

* cited by examiner

LOW-TEMPERATURE POLYSILICON MEMBRANE AND PREPARATION METHOD THEREOF, THIN-FILM TRANSISTOR AND DISPLAY DEVICE

The application is a U.S. National Phase Entry of International Application No. PCT/CN2014/076046 filed on Apr. 23, 2014, designating the United States of America and claiming priority to Chinese Patent Application No. 201310722877.7 filed on Dec. 24, 2013. The present application claims priority to and the benefit of the above-identified applications and the above-identified applications are incorporated by reference herein in their entirety.

TECHNICAL FIELD

Embodiments of the present invention relate to a low-temperature polysilicon (LTPS) membrane and a preparation method thereof, and a thin-film transistor (TFT) and a display device employing the LTPS membrane.

BACKGROUND

In a flat-panel display device, e.g., a liquid crystal display (LCD), an organic light-emitting diode (OLED) display or an inorganic electroluminescent (EL) display, TFT is generally used as a switching element to control pixels or used as a drive element to drive the pixels. The TFTs can be divided into amorphous silicon (a-Si) TFTs and polysilicon (Poly-Si) TFTs according to the properties of a silicon membrane used for an active layer. Compared with the a-Si TFT, a Poly-Si TFT has the characteristics of higher electron mobility, lower drain current and the like. Thus, the display manufactured via the Poly-Si TFT could have higher resolution and faster response speed.

The process for preparing the Poly-Si membrane can be divided into two categories. One involves a high-temperature process. In the preparation process, the temperature is higher than 600 centigrade, and a substrate is made from expensive quartz. The other involves a low-temperature process. In the whole processing technique, the temperature is lower than 600 centigrade, and the substrate may be made from cheap glass. Thus, the LTPS technology has gradually become the mainstream technology in the research and development of TFTs and in place of the a-Si technology. In the preparation of LTPS, the problem of Poly-Si crystallization has always been the focus of research in the field of LTPS.

The mature LTPS preparation process in the current industry mainly comprises for example solid phase crystallization (SPC), metal-induced lateral crystallization (MILC) and excimer laser crystallization (ELC). The ELC technology is commonly used in the crystallization of a-Si in the industry due to high electron mobility and productivity of products thereof. ELC involves applying high-power laser beams to act on the surface of an a-Si membrane to be crystallized. Because silicon materials have strong ultraviolet light absorption capability, the laser beams can drive the surface of the a-Si membrane to reach the high temperature of more than 1,000 centigrade and be in a molten state within a very short time period (about 50 ns to 150 ns). After the laser pulse is stopped, the a-Si in the molten state is cooled and crystallized into Poly-Si. The Poly-Si membrane prepared by an ELC process has the advantages of large crystal grains, good spatial selectivity, high doping efficiency, low intracrystalline imperfection, good electrical properties and high mobility, and is an LTPS membrane with an optimal overall performance currently. However, the Poly-Si membrane prepared by an ELC process also has defects. That is to say, the size of the crystal grains is sensitive to the laser power, and the prepared Poly-Si membrane has poor uniformity. Thus, products (e.g., TFTs) prepared by the Poly-Si membrane have large performance difference.

In summary, the Poly-Si membrane prepared by the ELC technology currently has poor uniformity, and hence the performances of the products prepared by the Poly-Si membrane can be disadvantageously affected.

SUMMARY

At least one embodiment of the present invention provide an LTPS membrane and a preparation method thereof, a TFT and a display device, which are used for overcoming poor uniformity of the Poly-Si membrane prepared by the ELC technology.

At least one embodiment of the present invention provides a method for preparing an LTPS membrane, which comprises: forming a pattern of an a-Si layer on a substrate by a patterning process, wherein the a-Si layer comprises a plurality of convex structures and etched areas which are disposed along circumference of the plurality of convex structures and partially etched; and performing an ELC process on the a-Si layer and obtaining the LTPS membrane. In some embodiments of the present invention, the formed a-Si layer comprises the plurality of convex structures which act as nucleuses in the subsequent crystallization process and can be used for uniform nucleation. Thus, the uniform distribution of Poly-Si crystal grains can be guaranteed and the size of the crystal grains can be increased.

In some embodiments of the present invention, a buffer layer is formed on the substrate, and hence the a-Si layer is formed on the buffer layer on the substrate.

For instance, in the preparation process, forming the pattern of the a-Si layer on the substrate by a patterning process may comprise: depositing a layer of a-Si membrane on the substrate; and selectively etching the a-Si membrane, forming the etched areas of the a-Si layer in etched areas of the a-Si membrane, and forming the plurality of convex structures of the a-Si layer in non-etched areas of the a-Si membrane.

For instance, the plurality of convex structures are equidistantly distributed on the a-Si layer.

For instance, in the preparation process, after forming the pattern of the a-Si layer on the substrate and before performing an ELC process on the a-Si layer, the method may further comprise: depositing an insulation layer, used for preventing the heat loss on the surface of the a-Si layer, on the a-Si layer of the substrate so as to further increase the size of Poly-Si crystal grains.

For instance, the insulation layer comprises a silicon dioxide ($SiO_2$) or silicon nitride (SiNx) single-layer film or a $SiO_2$ and SiNx composite layer film.

At least one embodiment of the present invention further provides an LTPS membrane, which is prepared by any foregoing method. Crystal grains of the LTPS membrane are uniformly distributed and have large size.

At least one embodiment of the present invention further provides a TFT employing the LTPS membrane which can be taken as an active layer of the TFT.

At least one embodiment of the present invention further provides a method for manufacturing a TFT, which may comprise: forming an active layer of the TFT. Forming the active layer comprises: forming a pattern of an a-Si layer on a substrate by a patterning process, wherein the a-Si layer comprises a plurality of convex structures and etched areas which are disposed along circumference of the plurality of convex structures and partially etched; performing an ELC process on the a-Si layer and obtaining an LTPS membrane; and forming a pattern of the active layer by performing patterning process on the LTPS membrane.

For instance, before forming the pattern of the a-Si layer, the method may further comprise: forming a buffer layer on the substrate; or forming a pattern of a gate electrode on the substrate by a patterning process and forming a buffer layer on the substrate provided with the gate electrode.

For instance, forming the pattern of the a-Si layer on the substrate by a patterning process comprises: depositing a layer of a-Si membrane on the substrate; and selectively etching the a-Si membrane, forming the etched areas of the a-Si layer in etched areas of the a-Si membrane, and forming the plurality of convex structures of the a-Si layer in non-etched areas of the a-Si membrane.

For instance, the plurality of convex structures are equidistantly distributed on the a-Si layer.

For instance, after forming the pattern of the a-Si layer on the substrate and before performing an ELC process on the a-Si layer, the method may further comprise: depositing an insulation layer, used for preventing the heat loss on the surface of the a-Si layer, on the a-Si layer of the substrate.

For instance, after performing an ELC process on the a-Si layer, the method may further comprise: removing the insulation layer on the LTPS membrane.

At least one embodiment of the present invention further provides a display device, which comprises the foregoing TFT. The TFT may be taken as a switching element to control pixels or may be taken as a drive element to drive the pixels.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

In at least one embodiment of the present invention, the a-Si layer formed on the substrate comprises a plurality of convex structures. In the crystallization process of the a-Si layer, the plurality of convex structures may be taken as nucleuses and hence can be used for uniform nucleation. Thus, the uniform distribution of formed Poly-Si crystal grains can be guaranteed. Non-molten portions of the convex structures in the partial molten state are taken as nucleuses in the subsequent crystallization process. Further detailed description will be given below to the embodiments of the present invention with reference to the accompanying drawings of the description.

Figure 1:
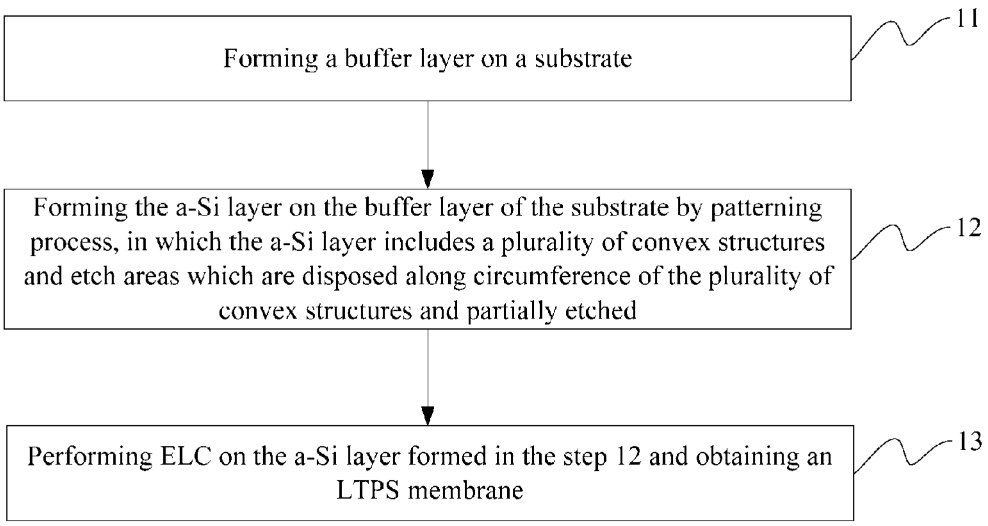
FIG. 1 is a schematic diagram of a method for preparing an LTPS membrane, provided by an embodiment of the present invention.

As illustrated in FIG. 1, at least one embodiment of the present invention provides a method for preparing an LTPS membrane. The method comprises the following steps:

Step 11: Forming a buffer layer on a substrate to prevent impurities on the substrate from entering an a-Si layer and affecting the performances of the a-Si layer.

In this step, the buffer layer is formed by depositing a buffer layer film on the substrate by chemical vapor deposition (CVD).

Preferably, the buffer layer is formed by depositing a buffer layer film on the substrate by plasma enhanced chemical vapor deposition (PECVD).

Preferably, the buffer layer may adopt a $SiO_2$/SiNx single-layer film or a $SiO_2$ and SiNx composite layer film.

Preferably, the thickness of the buffer layer formed in the step is 2,000 to 4,000 Å. Of course, the thickness of the buffer layer may also be set to be other values according to actual preparation demands. The buffer layer may comprise at least one layer, and, for instance, may also be a composite layer formed with different material layers.

In the preparation process, before the step is executed, the substrate may be cleaned in advanced so as to keep it clean.

In the step, the substrate may adopt a commonly used substrate such as an alkali-free glass substrate, a resin substrate and a quartz substrate.

In other embodiments of the present invention, the buffer layer is not formed on the substrate and the subsequent step of forming the a-Si layer on the substrate is directly performed.

Step 12: Forming an a-Si layer on the buffer layer of the substrate by a patterning process, in which the a-Si layer comprises a plurality of convex structures and etched areas which are disposed along circumference of the plurality of convex structures and partially etched.

In this step, the a-Si layer is formed on the buffer layer of the substrate by a patterning process, and the formed a-Si layer comprises a plurality of convex structures and etched areas which are disposed along circumference of the plurality of convex structures and partially etched. For instance, a-Si membrane areas in which the convex structures are formed may be protected in a photolithography process; other areas are etched (namely the etched areas are formed); and finally, the plurality of uniformly distributed convex structures are formed in the protected areas. The convex structures are used as nucleuses in the subsequent crystallization process and can be used for uniform nucleation. Thus, the uniform distribution of Poly-Si crystal grains can be guaranteed.

In the preparation process, in order to further guarantee the uniform distribution of the crystal grains of the formed LTPS membrane, preferably, the plurality of formed convex structures are equidistantly distributed, so that the a-Si layer exhibits uniformly distributed hilly topography, and hence the uniform distribution of the crystal grains can be further guaranteed.

In some embodiments of the present invention, the patterning processes are, for instance, photolithography patterning processes, and comprise: coating a photoresist layer, exposing the photoresist layer with a mask plate, developing the exposed photoresist layer, obtaining a photoresist pattern, etching a structural layer by the photoresist pattern, optionally removing the photoresist pattern, and so on. In other embodiments of the present invention, the process for forming the photoresist pattern may also be screen printing method, inkjet printing method or the like.

Step 13: Performing an ELC process on the a-Si layer formed in the step 12 and obtaining an LTPS membrane.

In the step, in the process of performing an ELC process on the formed a-Si layer, as the thickness of the a-Si layer formed in the step 12 is in a regularly distributed fluctuation, the critical completely-melted energy density of the a-Si layer with an unequal thickness (the areas provided with the convex structures and the etched areas have an unequal thickness) is inevitably different. There must be an energy density window on the critical melted energy density of the etched areas with a low thickness, and in this window the convex structures with a large thickness on the etched areas are in the incomplete molten state, and hence the convex structures can be uniformly nucleated in the crystallization process. Thus, the uniform distribution of the Poly-Si crystal grains can be guaranteed and the size of the crystal grains can be increased.

Experiments show that the size of the crystal grains of the LTPS membrane prepared in the preparation method known to the inventors is generally about 400 nm, but the size of the crystal grains of the LTPS membrane prepared by at least one embodiment of the present invention can at least reach 600 to 1,000 nm. Thus, the size of the crystal grains can be increased.

In the preparation process, in the step 13, when the formed a-Si layer is subjected to the ELC process, the a-Si layer may be subjected to excimer laser annealing for once, twice or more times according to the properties of the a-Si layer such as thickness and material, and hence the Poly-Si membrane can be formed.

For instance, the formed a-Si layer is subjected to excimer laser annealing once. The processing parameters are as follows: the laser pulse frequency is 500 Hz, and the adopted laser energy density is 350 to 450 $mJ/cm^2$.

In the preparation process, one example of forming the a-Si layer on the buffer layer of the substrate by a patterning process comprises: depositing a layer of a-Si membrane on the buffer layer of the substrate; and selectively etching the a-Si membrane. Etch areas of the a-Si layer are formed in etched areas of the a-Si membrane, and a plurality of convex structures of the a-Si layer are formed in non-etched areas of the a-Si membrane.

In the preparation process, one layer of a-Si membrane may be deposited on the buffer layer of the substrate by CVD.

For instance, one layer of a-Si membrane may be deposited on the buffer layer of the substrate by PECVD.

For instance, in the step 12, the thickness of the a-Si membrane deposited on the buffer layer of the substrate is 400 to 800 Å. Of course, the thickness of the a-Si membrane may also be set to be other values according to actual preparation demands (e.g., the thickness of an active layer of a TFT to be prepared).

For instance, in the step 12, after the a-Si membrane is selectively etched, the thickness of the partially etched areas is 200 to 600 Å; a plurality of convex structures are formed in the non-etched areas; the height of each convex structure relative to the partially etched area is 100 to 200 Å; and the space between any two adjacent convex structures is 1,000 to 2,000 nm. Of course, the thickness of the etched areas, the height of the convex structures and the space between the two adjacent convex structures may also be set to be other values according to actual preparation demands (e.g., the size of the crystal grains of the LTPS membrane to be prepared).

In some embodiments of the present invention, the number of the convex structures in the a-Si layer may be determined according to the size of the substrate and the specified space between any two adjacent convex structures.

In at least one embodiment of the present invention, the shape of formed convex structures of the a-Si layer is not limited.

In some embodiments of the present invention, the formed convex structures of the a-Si layer adopt cylindrical structures, and the diameter of the convex structures is 200 to 300 Å. Of course, the diameter of the convex structures may also be set to be other values according to actual preparation demands. In other embodiments of the present invention, the convex structures may also adopt other shapes, e.g., prism.

In the preparation process, after the step 12 and before the step 13, the method provided by some embodiments of the present invention further comprises the following step: depositing an insulation layer, used for preventing the heat loss on the surface of the a-Si layer, on the a-Si layer of the substrate by, for instance, PECVD, so as to further increase the size of the obtained Poly-Si crystal grains.

In the step, one insulation layer is deposited on the a-Si layer. In the crystallization process of the a-Si layer, the heat loss on the surface of the a-Si layer can be prevented, so that the temperature difference between the upper layer and the lower layer of the a-Si layer can be reduced, and the size of the Poly-Si crystal grains can be further increased.

In the step, one insulation layer may be deposited on the a-Si layer by PECVD. The deposited insulation layer has good uniformity and high stability. Thus, the further increase of the size of the crystal grains after crystallization can be guaranteed.

For instance, the thickness of the insulation layer may be 1,000 to 2,000 Å. Of course, the thickness of the insulation layer may also be set to be other values according to actual preparation demands.

For instance, the insulation layer may adopt a $SiO_2$/SiNx single-layer film and may also adopt a $SiO_2$ and SiNx composite layer film.

Detailed description will be given below to the method for preparing the LTPS membrane with reference to a preferred embodiment.

Embodiment 1

Figure 2:
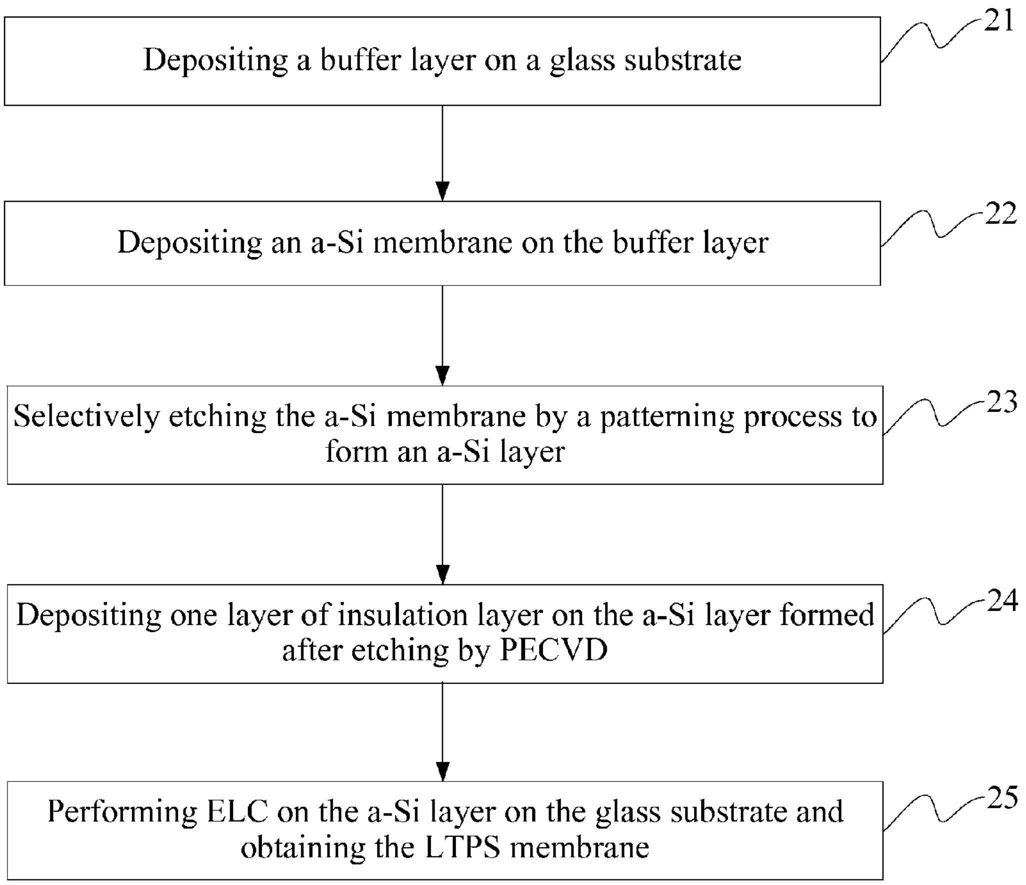
FIG. 2 is a schematic diagram of the preparation process provided by an embodiment of the present invention.
Figure 3:
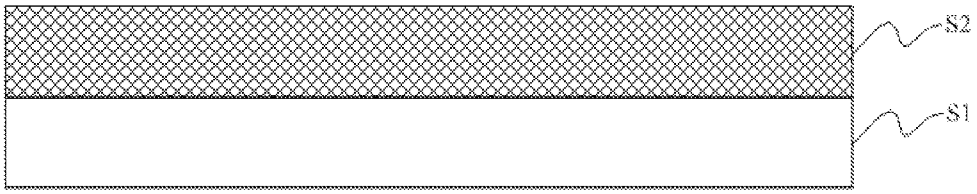
FIG. 3 is a schematic structural sectional view of the product obtained after an deposition of a buffer layer, in the embodiment of the present invention.

In the embodiment, a glass substrate is taken as the substrate. The preparation process is as shown in FIG. 2 and comprises the following steps:

Step 21: depositing a buffer layer S2 on a glass substrate S1. The sectional structure of the obtained product is as shown in FIG. 3. The buffer layer S2 adopts a $SiO_2$ film, with the thickness of 2,000 to 4,000 Å.

Figure 4:
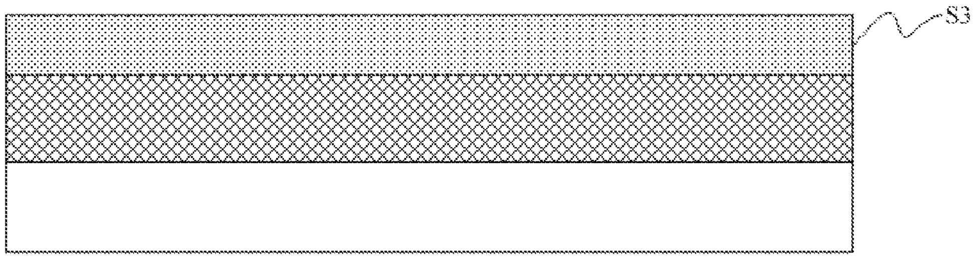
FIG. 4 is a schematic structural sectional view of the product obtained after an deposition of an a-Si membrane, in the embodiment of the present invention.

Step 22: depositing an a-Si membrane S3 on the buffer layer. The sectional structure of the obtained product is as shown in FIG. 4. The thickness of the a-Si membrane is 400 to 800 Å.

Figure 5A:
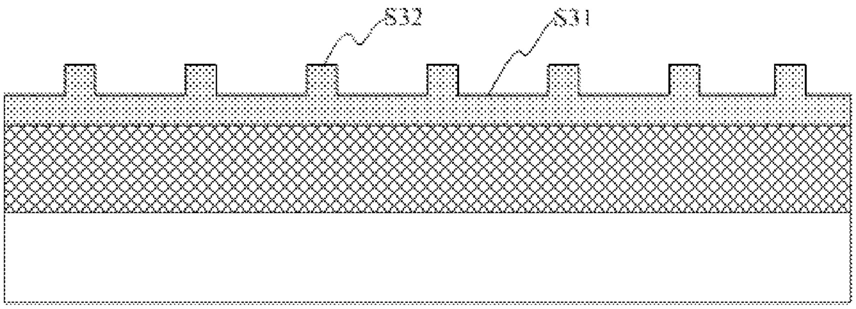
FIG. 5A is a schematic structural sectional view of a formed a-Si layer in an embodiment of the present invention.

Step 23: selectively etching the a-Si membrane S3 by a patterning process to form an a-Si layer. The sectional structure of the obtained product is as shown in FIG. 5A. Etched areas S31 of the a-Si layer are formed in the etched areas of the a-Si membrane S3, and a plurality of convex structures S32 of the a-Si layer are formed in non-etched areas of the a-Si membrane.

Figure 5B:
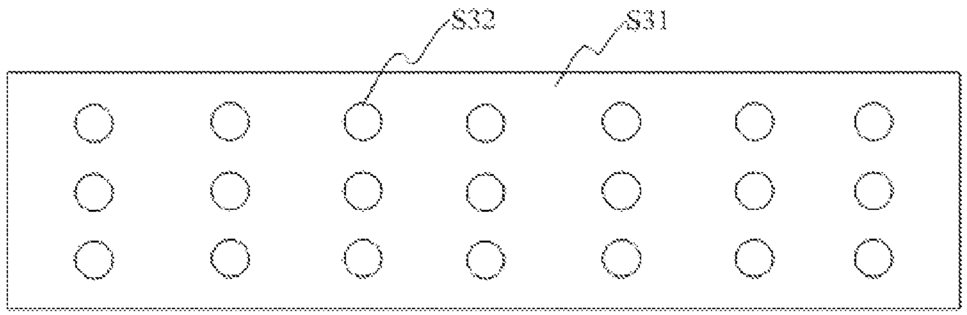
FIG. 5B is a schematic structural top view of the formed a-Si layer in an embodiment of the present invention.

The thickness of the film with large thickness in the a-Si layer is 400 to 800 Å larger than that of the traditional film. The thickness of the partially etched areas S31 is 200 to 600 Å after etching. The diameter of the columnar convex structures S32 formed on the etched areas S31 is 200 to 300 Å. The height of the columnar convex structures S32 relative to partially etched portions is 100 to 200 Å. The distribution space between any two adjacent convex structures is 1,000 to 2,000 nm. The top view of the obtained product is as shown in FIG. 5B.

This step adopts the method of selective etching. The formed a-Si layer comprises a plurality of columnar convex structures that are equidistantly distributed and etched areas disposed along the circumference of the convex structures, so that the convex structures are in the incomplete molten state in the crystallization process, and uniform nucleation can be achieved. Thus, the uniform distribution of the prepared Poly-Si crystal grains can be guaranteed and the size of the crystal grains can be increased.

Figure 6:
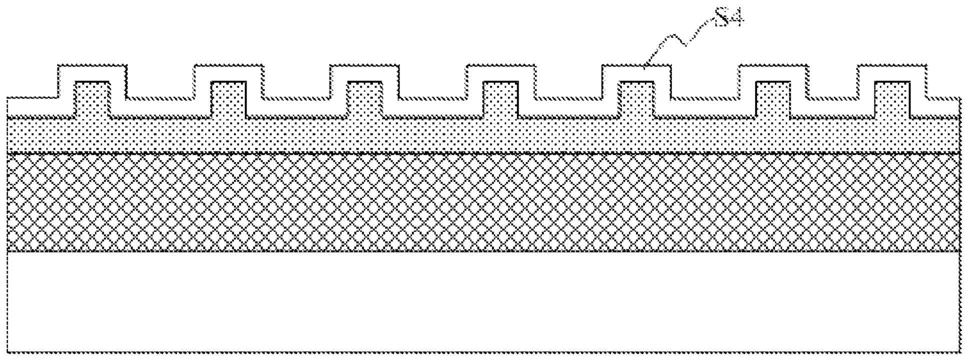
FIG. 6 is a schematic structural top view of the product obtained after the deposition of an insulation layer in an embodiment of the present invention.

Step 24: depositing an insulation layer S4 on the a-Si layer formed after etching by PECVD. The sectional structure of the obtained product is as shown in FIG. 6.

The thickness of the insulation layer S4 is 1,000 to 2,000 Å. As the insulation layer S4 can prevent the heat loss on the surface of the a-Si layer, the size of the crystal grains after crystallization can be further increased. Preferably, the insulation layer S4 may adopt a $SiO_2$/SiNx single-layer film and may also adopt a $SiO_2$ and SiNx composite layer film. In other embodiments of the present invention, the a-Si layer is not provided with the insulation layer.

Step 25: performing an ELC process on the a-Si layer on the glass substrate S1 and obtaining the LTPS membrane.

For instance, when the laser pulse frequency is 500 Hz, the adopted laser energy density is 350-450 $mJ/cm^2$, and the a-Si layer on the glass substrate S1 is crystallized.

Another embodiment of the present invention further provides an LTPS membrane which is prepared by any forgoing method. The crystal grains of the LTPS membrane are uniformly distributed and have large size.

Another embodiment of the present invention further provides a TFT employing the LTPS membrane which may be taken as an active layer of the TFT.

Other structures (e.g., a gate electrode, a gate insulating layer and source/drain electrodes) of the TFT are not defined in the embodiment of the present invention, as long as the active layer of the TFT is prepared by the LTPS membrane provided by the embodiment of the present invention. The TFT provided by an embodiment of the present invention, for instance, may be of a top-gate type (the gate electrode is disposed over the active layer) or a bottom-gate type (the gate electrode is disposed beneath the active layer and disposed between the active layer and the substrate). The gate insulating layer is disposed between the gate electrode and the active layer. The source/drain electrodes contact source/drain areas of the active layer respectively.

Some embodiments of the present invention further provide a method for manufacturing a TFT. The method comprises: preparing a gate electrode, a gate insulating layer, an active layer, source/drain electrodes and the like of the TFT. The method for preparing the active layer of the TFT comprises: forming a pattern of an a-Si layer on a substrate provided with a buffer layer by a patterning process, in which the a-Si layer comprises a plurality of convex structures and etched areas which are disposed along circumference of the plurality of convex structures and partially etched; performing an ELC process on the a-Si layer and obtaining an LTPS membrane; and forming a pattern of the active layer by performing patterning process on the LTPS membrane.

In the method for manufacturing the TFT, provided by some embodiments of the present invention, the active layer of the TFT is prepared by the LTPS membrane. Other structures of the TFT are not defined here, as long as the method for manufacturing the TFT in which the active layer is prepared by the LTPS membrane provided by the embodiment of the present invention falls within the embodiment of the present invention.

For instance, the buffer layer may adopt a $SiO_2$/SiNx single-layer film or a $SiO_2$ and SiNx composite layer film.

For instance, the thickness of the buffer layer formed on the substrate is 2,000 to 4,000 Å. Of course, the thickness of the buffer layer may also be set to be other values according to actual preparation demands.

In some embodiments of the present invention, in the process of manufacturing the TFT, the active layer may be formed at first and hence the gate electrode is formed. In the manufacturing method, before forming the pattern of the a-Si layer, the method further comprises: forming a buffer layer on the substrate.

In the method, the buffer layer may be formed by depositing a buffer layer film on the substrate by CVD.

For instance, the buffer layer is formed by depositing a buffer layer film on the substrate by PECVD.

In other embodiments of the present invention, in the process of manufacturing the TFT, the gate electrode may be formed at first and hence the active layer is formed. The manufacturing method, before forming the pattern of the a-Si layer, further comprises: forming a pattern of the gate electrode on the substrate by a patterning process; and forming a buffer layer on the substrate provided with the gate electrode. In the method, the buffer layer is the gate insulating layer of the TFT.

In the preparation method, forming the pattern of the a-Si layer on the substrate provided with the buffer layer by a patterning process may comprise: depositing a layer of a-Si membrane on the substrate provided with the buffer layer; and selectively etching the a-Si membrane, in which etched areas of the a-Si layer are formed in etched areas of the a-Si membrane, and a plurality of convex structures of the a-Si layer are formed in non-etched areas of the a-Si membrane.

In the preparation process, in order to further guarantee the uniform distribution of the crystal grains of the formed LTPS membrane, preferably, the plurality of convex structures are equidistantly distributed on the a-Si layer.

In the preparation process, after forming the a-Si layer on the substrate provided with the buffer layer and before performing an ELC process on the a-Si layer, the method may further comprise: depositing an insulation layer, used for preventing the heat loss on the surface of the a-Si layer, on the a-Si layer by PECVD.

In the step, an insulation layer is deposited on the a-Si layer. In the crystallization process of the a-Si layer, the heat loss on the surface of the a-Si layer can be prevented, so that the temperature difference between the upper layer and the lower layer of the a-Si layer can be reduced, and hence the size of the Poly-Si crystal grains can be further increased.

For instance, the thickness of the insulation layer may be 1,000 to 2,000 Å. Of course, the thickness of the insulation layer may also be set to be other values according to actual preparation demands.

For instance, the insulation layer may adopt a $SiO_2$/SiNx single-layer film and may also adopt a $SiO_2$ and SiNx composite layer film.

Moreover, after performing an ELC process on the a-Si layer, the method may further comprise: removing the insulation layer on the LTPS membrane.

For instance, after performing an ELC process on the a-Si layer, the LTPS membrane is formed, and the insulation layer on the LTPS membrane may be removed by dry etching.

For instance, after performing an ELC process on the a-Si layer and before forming the pattern of the active layer, the insulation layer on the LTPS membrane is removed.

Still another embodiment of the present invention further provides a display device, which comprises the foregoing TFT. Preferably, the TFT may be taken as a switching element to control pixels or taken as a drive element to drive the pixels.

The display device provided by at least one embodiment of the present invention may be: any product or component with display function such as an LCD panel, e-paper, an OLED panel, a mobile phone, a tablet PC, a TV, a display, a notebook computer, a digital picture frame and a navigator.

The display device is applicable to a plurality of types of displays such as LCD, OLED display, inorganic EL display and active matrix organic light emitting diode (AMOLED) display.

One example of the display device is an LCD device, in which an array substrate and an opposing substrate are arranged opposite to each other to form a liquid crystal cell, and liquid crystal materials are filled in the liquid crystal cell. The opposing substrate is, for instance, a color filter (CF) substrate. In some examples, the LCD device further comprises a backlight. The array substrate comprises a plurality of gate lines and a plurality of data lines which are intersected with each other to define pixel units arranged in a matrix. Each pixel unit comprises a TFT taken as a switching element. The TFT is, for instance, the TFT provided by the embodiment of the present invention.

Obviously, various modifications and deformations can be made to the present invention by those skilled in the art without departing from the spirit and scope of the present invention. Therefore, if the modifications and deformations of the present invention fall within the scope of the appended claims of the present invention and equivalents thereof, the present invention is also intended to comprise the modifications and deformations.

The application claims priority to the Chinese patent application No. 201310722877.7 submitted on Dec. 24, 2013. The disclosure content of the Chinese patent application is incorporated herein by reference as part of the application.

The invention claimed is:

1. A method for preparing a low temperature poly-silicon (LTPS) membrane, comprising:
   - forming a pattern of an amorphous silicon (a-Si) layer on a substrate by a patterning process, wherein the a-Si layer comprises a plurality of convex structures and an etched area which is disposed along circumference of the plurality of convex structures and partially etched, and the plurality of convex structures are connected to each other by amorphous silicon in the etched area;
   - depositing an insulation layer, used for preventing heat loss on a surface of the a-Si layer, on the a-Si layer of the substrate; and
   - performing excimer laser crystallization (ELC) on the a-Si layer with the insulation layer being on the surface of the a-Si layer and obtaining the LTPS membrane.

2. The method according to claim 1, comprising: forming a buffer layer on the substrate and forming the a-Si layer on the buffer layer on the substrate.

3. The method according to claim 2, wherein the forming the pattern of the a-Si layer on the substrate by the patterning process comprises:
   - depositing a layer of a-Si membrane on the substrate; and
   - selectively etching the a-Si membrane, forming an etched area of the a-Si layer in an etched area of the a-Si membrane, and forming the plurality of convex structures of the a-Si layer in non-etched areas of the a-Si membrane.

4. The method according to claim 1, wherein the forming the pattern of the a-Si layer on the substrate by the patterning process comprises:
   - depositing a layer of a-Si membrane on the substrate; and
   - selectively etching the a-Si membrane, forming the etched area of the a-Si layer in an etched area of the a-Si membrane, and forming the plurality of convex structures of the a-Si layer in non-etched areas of the a-Si membrane.

5. The method according to claim 1, wherein the plurality of convex structures are equidistantly distributed on the a-Si layer.

6. The method according to claim 1, wherein the insulation layer comprises a silicon dioxide ($SiO_2$) or silicon nitride (SiNx) single-layer film or a $SiO_2$ and SiNx composite layer film.

7. A low temperature poly-silicon (LTPS) membrane, prepared by the method according to claim 1.

8. A thin-film transistor (TFT), adopting the LTPS membrane according to claim 7 as an active layer.

9. A display device, comprising the TFT according to claim 8.

10. A method for manufacturing a thin film transistor (TFT), comprising:
    - forming a pattern of an a-Si layer on a substrate by a first patterning process, wherein the a-Si layer comprises a plurality of convex structures and an etched area which is disposed along circumference of the plurality of convex structures and partially etched, and the plurality of convex structures are connected to each other by amorphous silicon in the etched area;
    - depositing an insulation layer, used for preventing heat loss on a surface of the a-Si layer, on the a-Si layer of the substrate;
    - performing an ELC process on the a-Si layer with the insulation layer being on the surface of the a-Si layer and obtaining an LTPS membrane; and
    - forming a pattern of an active layer by performing a second patterning process on the LTPS membrane.

11. The method according to claim 10, before the forming the pattern of the a-Si layer, further comprising:
    - forming a buffer layer on the substrate; or forming a pattern of a gate electrode on the substrate by a third patterning process and forming a buffer layer on the substrate provided with the gate electrode.

12. The method according to claim 10, wherein the forming the pattern of the a-Si layer on the substrate by the first patterning process comprises:
    - depositing a layer of a-Si membrane on the substrate; and
    - selectively etching the a-Si membrane, forming the etched area of the a-Si layer in an etched area of the a-Si membrane, and forming the plurality of convex structures of the a-Si layer in non-etched areas of the a-Si membrane.

13. The method according to claim 10, wherein the plurality of convex structures are equidistantly distributed on the a-Si layer.

14. The method according to claim 10, after the performing the ELC process on the a-Si layer, further comprising:

removing the insulation layer on the LTPS membrane.

* * * * *